United States Patent [19]

Hiraiwa et al.

[11] 4,311,749

[45] Jan. 19, 1982

[54] FLAME-PROOF FLEXIBLE PRINTED CIRCUIT BOARD

[75] Inventors: Takashi Hiraiwa, Anjo; Yuichi Fujita, Kariya, both of Japan

[73] Assignee: Nippondenso Co., Ltd., Kariya, Japan

[21] Appl. No.: 937,198

[22] Filed: Aug. 28, 1978

[30] Foreign Application Priority Data

Sep. 6, 1977 [JP] Japan .................... 52-106905

[51] Int. Cl.³ ................................ H05K 1/00
[52] U.S. Cl. ................................ 428/209; 174/68.5; 427/40; 427/96; 428/458; 428/461; 428/463; 428/901; 428/921
[58] Field of Search ........... 427/96, 207 C, 40, 209, 427/307, 385 R, 386, 388 R, 409, 410, 41; 428/921, 458, 209, 461, 463, 901; 96/36.2; 174/68.5

[56] References Cited

U.S. PATENT DOCUMENTS

| | | | |
|---|---|---|---|
| 3,534,147 | 10/1970 | Bratton et al. | 427/96 |
| 4,027,063 | 5/1977 | Fujiwara et al. | 96/36.2 X |
| 4,054,720 | 10/1977 | Tomita et al. | 428/921 X |
| 4,136,225 | 1/1979 | Feit | 427/96 |
| 4,140,831 | 2/1979 | Miller | 427/98 |

FOREIGN PATENT DOCUMENTS

51-30966  3/1976  Japan .................... 428/208

*Primary Examiner*—John D. Smith
*Attorney, Agent, or Firm*—Cushman, Darby & Cushman

[57] ABSTRACT

A flexible printed circuit board having excellent flame proofness and a very little danger of causing a fire can be produced by subjecting a substrate or an insulating film consisting of a flexible resin film to surface treatment to provide a surface tension of 36 dyne/cm or more and then forming a resin film containing a flame retardant on the treated surface of said substrate or insulating film.

13 Claims, 5 Drawing Figures

FLAME-PROOF FLEXIBLE PRINTED CIRCUIT BOARD

BACKGROUND OF THE INVENTION

The present invention relates to a flexible printed circuit board having excellent flame proofness and a very little danger of causing a fire.

In general, flexible printed circuit boards such as the printed circuit of a speedometer for automobiles have heretofore been produced by fastening a metal foil such as a copper foil constituting an electric circuit onto a flexible substrate consisting of a resin film, for example, a polyester resin film with an adhesive. Further, for the insulation of the electric circuit, the metal foil is coated with a flexible film of a resin such as a polyester resin. The flexible printed circuit boards permit the production of a remarkably lighter printed circuit board and a remarkable reduction in cost as compared with printed circuit boards using a phenol resin laminated board as a substrate which have previously often been employed. Therefore, it is expected that the flexible printed circuit boards will have various uses. In the flexible printed circuit boards, however, an inflammable flexible film such as a polyester film is widely used as a substrate and as an insulating film from the viewpoints of cost and processability. Therefore, heat is generated when an excess current flows on a copper foil constituting an electric circuit. In this case, a fuse portion formed in the circuit for safety by narrowing the copper foil burns out and the substrate, the insulating film or the adhesive catches fire. A flame spreads at a fairly high speed and a fire is caused from this portion. Thus, the flexible printed circuit boards are a possible cause of causing a fire. This is the reason why the flexible printed circuit boards have not yet been put to practical use widely.

Therefore, an object of the present invention is to obviate the defect of prior art flexible printed circuit boards.

Another object of the invention is to provide a flexible printed circuit board having excellent flame proofness and a very little danger of causing a fire.

BRIEF DESCRIPTION OF THE DRAWINGS

The other objects and advantages of the present invention will be apparent from the following description and claims, taken in conjunction with the accompanying drawings in which:

DETAILED DESCRIPTION OF THE INVENTION

According to the present invention, there is provided a flame-proof flexible printed circuit board comprising a copper foil constituting an electric circuit and a flexible resin film fastened onto one surface or both surfaces of said copper foil with an adhesive wherein said flexible resin film is subjected to surface treatment to provide a surface tension of 36 dyne/cm or more and a resin film containing a flame retardant is then formed on the treated surface of said flexible resin film.

The following examples illustrate the present invention in more detail.

EXAMPLE 1

Figure 1:
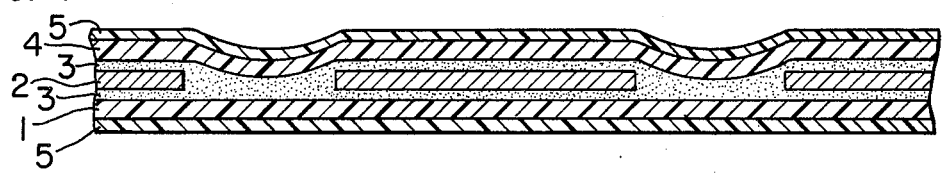
FIGS. 1 to 5 are sectional views of the flame-proof flexible printed circuit boards according to the present invention as produced in Examples 1, 2, 3, 4 and 5, respectively.

This example illustrates the formation of a flexible printed circuit board as shown in FIG. 1 by coating a fire proofing film 5 consisting of a flame proofing mixture of a resin and a flame retardant onto the surfaces of a substrate 1 and an insulating film 4 each consisting of a flexible resin film.

Although polyester, polyvinyl chloride, polypropylene, polyethylene, polyamide and polyimide resins may be used as the flexible resin film used in the present invention, a polyester resin was used in this example. Also, as the resin used in the flame proofing mixture, an epoxy resin, a polyurethane resin or a polyester resin, which were comparatively excellent in adhesive property for the substrate 1 or the insulating film 4, was used. Further, as the flame retardant to be mixed with said resins, a halogenated organo phosphoric acid ester, a halogenated aromatic acid anhydride or a halogenated aromatic compound was used. It goes without saying that the flame proofing film contains such constituent materials as a curing agent, a diluting solvent, etc. required for the constitution of the flame proofing film.

The process for producing the flexible printed circuit board will be explained below. A polyester resin film (Diafoil NF manufactured by Mitsubishi Diafoil Co., Ltd. in Japan) having a thickness of $75\mu$ as a substrate 1 is first subjected to surface treatment by corona discharge to improve the adhesion between the substrate 1 and the flame proofing film 5. It has been found that it is preferable that the surface tension of the corona discharge-treated polyester surface is 50 dyne/cm or more. In the case of the other treatments, for example, ultraviolet ray irradiation treatment, however, it has been found that satisfactory adhesion can be secured if the surface tension is 36 dyne/cm or more. If the surface tension exceeds 60 dyne/cm, it is necessary to place a releasing paper between polyester resin films as there is the possibility that blocking occurs if one polyester resin film is put on top of another. Therefore, a polyester resin film the surface tension of which had been adjusted to 50 to 60 dyne/cm by corona discharge treatment was used in this example. Said flame proofing mixture was then spray-coated onto the surface of the substrate 1 at an appointed viscosity, an appointed air pressure and an appointed amount exhausted. The resulting coating was allowed to stand at room temperature for 5 to 10 minutes to smooth the flame proofing film 5, and was then cured by heating in a thermostat under appointed curing conditions. A sheet-form hot melt type adhesive 3 (Vyron 30P manufactured by Toyo Spinning Co., Ltd. in Japan) having a thickness of 20 to $30\mu$ was inserted between the substrate 1 thus coated with the flame proofing film 5 and a copper foil (an electrolytic copper foil manufactured by Fukuda Kinzoku Hakufun Co., Ltd. in Japan) 2 having a thickness of $35\mu$ for consituting an electric circuit and pressed by an oil pressure press to bond the substrate 1 with the copper foil 2 at an elevated temperature. Here, the curing conditions were temperature 160° C., pressure 6 kg/cm$^2$ and time 5 seconds. The whole was then dripped in a copper etching solution consisting mainly of ferric chloride to remove the portion of the copper foil other than the portion necessary as an electric circuit, washed with water and then dried.

A flame proofing film 5 was then further formed on the surface of the insulating film 4. In the same manner as in the above-mentioned formation of the flame proofing film 5 on the substrate 1, the flame proofing film 5 was formed on an insulating film 4 consisting of a polyester resin film (Diafoil NF #50 manufactured by Mitsubishi Diafoil Co., Ltd. in Japan) having a thickness of 50μ. Further, said adhesive 3 was inserted between the insulating film 4 and the copper foil 2, and the whole was heated and pressend under the same conditions as those described above to bond the insulating film 4 with the copper foil 2. Thus, the flexible printed circuit board as shown in FIG. 1 was completed.

Next, the flexible printed circuit boards obtained in this example will be explained with reference to the experimental results as shown in Tables 1 to 3. As a resin used in the flame proofing mixture constituting the flame proofing film 5, an epoxy resin was used in the samples of Table 1, a polyurethane resin was used in the samples of Table 2, and a polyester resin was used in the samples of Table 3. Also, as a flame retardant, tris(2,3-dibromopropyl)phosphate, tetrabromophthalic anhydride and tetrabromobisphenol A were selected from halogenated organo phosphoric acid esters, halogenated aromatic acid anhydrides and halogenated aromatic compounds, respectively. The blending ratios of these flame retardents to each of the above-mentioned resins were varied, and flame proofness and the adhesion between the flexible film in the substrate 1 or the insulating film 4 and the flame proofing film 5 were estimated. As a result, a blending ratio satisfying the requirements of flame proofness and adhesion was obtained in all combinations of a resin and a flame retardent constituting the flame proofing film 5 as shown in Tables 1 to 3. According to the present inventors' experiments, it was found that samples of Experiments Nos. 5, 6, 9, 10, 14 and 15 in Table 1, Experiments Nos. 21, 26 and 30 in Table 2, and Experiments Nos. 41, 46 and 51 in Table 3 showed particularly good flame proofness and adhesion. If only flame proofness is required, useful samples are not limited to these ones. The spray coating conditions for a flame proofing mixture in the experiments in Tables 1 to 3 were the viscosity of the flame proofing mixture $18 \times 2$ sec/Ford cup #4, 20° C., the pressure of air $4.0 \pm 0.2$ kg/cm$^2$, an amount exhausted $35 \pm 2$ mg/min. The thickness of the flame proofing film after curing was 5 to 15μ. In the experiments in Tables 1 to 3, three each of the resins and flame retardants constituting the flame proofing film 5 were selected and used. However, it was found that a good quality was able to be obtained by replacing the resins and flame retardants by the other resins and flame retardants, for example, an acrylic resin as a resin and halogenated aliphatic compounds and inorganic or organic antimony compounds as a flame retardant or by using a mixture of two or more of the resins and/or a mixture of two or more of the flame retardants. Further, with regard to the thickness of the fire proofing film and coating method, the present invention is not limited to the above-mentioned example. Also, even if a fire proofing film is formed on only any one of the flexible film of the substrate 1 and the flexible film of the insulating film 4, the effect of securing fire proofness can be still obtained. Further, the surface treatment of the flexible film of the substrate 1 or the flexible film of the insulating film 4 at their surface to be coated with a fire proofing film 5 for improving adhesion is not limited to corona discharge treatment although corona discharge treatment is low in cost. The other methods such as chemical treatment can also produce satisfactory effects.

TABLE 1

(Example 1)

| Experiment No. | Resin | Flame retardant Name | Amount blended (parts by wt.) | Fire proofness, combustion test according to MVSS No. 302 Burning rate (cm/min) | Burning distance (mm) | Adhesion peeling test by adhesive tape |
| --- | --- | --- | --- | --- | --- | --- |
| 1 | | — | — | 17–20 | Continued to burn | Good |
| 2 | | | 40 | 5–10 | 5–10 | Good |
| 3 | Epoxy resin 100 parts by weight | Tris(2,3-dibromopropyl) phosphate | 80 | 0.5–1 | 5–7 | Good |
| 4 | | | 120 | Immediately fire died out | <5 | Good |
| 5 | Curing agent | | 160 | Immediately fire died out | " | Good |
| 6 | 3 parts by weight | | 200 | Immediately fire died out | " | Slightly bad |
| 7 | | | 40 | 3–5 | 5–10 | Good |
| 8 | | | 80 | 0.5–0.7 | 5–8 | Good |
| 9 | | Tetrabromophthalic anhydride | 120 | Immediately fire died out | <5 | Good |
| 10 | | | 160 | Immediately fire died out | " | Good |
| 11 | | | 200 | Immediately fire died out | " | Slightly bad |
| 12 | | | 40 | 8–10 | 12–15 | Good |
| 13 | | | 80 | 1–2 | 5–10 | Good |
| 14 | | Tetrabromobisphenol A | 120 | Immediately fire died out | <5 | Good |
| 15 | | | 160 | Immediately fire died out | " | Good |
| 16 | | | 200 | Immediately | " | Slightly bad |

TABLE 1-continued
(Example 1)

| Experiment No. | Resin | Flame retardant Name | Amount blended (parts by wt.) | Fire proofness, combustion test according to MVSS No. 302 Burning rate (cm/min) | Burning distance (mm) | Adhesion peeling test by adhesive tape |
|---|---|---|---|---|---|---|
| | | | | fire died out | | |

(Notes)
Epoxy resin: Epikote 828 20 parts by weight (Manufactured by Shell Chemical Co.) Epikote 871 80 parts by weight (Manufactured by Shell Chemical Co.)
Curing agent: EMI (Manufactured by Shikoku Kasei K.K. in Japan)
Curing conditions: 180° C., 15 minutes

TABLE 2

| Experiment No. | Resin | Flame retardant Name | Amount blended (parts by wt.) | Fire proofness, combustion test according to MVSS No. 302 Burning rate (cm/min.) | Burning distance (mm) | Adhesion, peeling test by adhesive tape |
|---|---|---|---|---|---|---|
| 17 | | — | — | 20–25 | Continued to burn | Good |
| 18 | | | 40 | 8–15 | 10–13 | Good |
| 19 | | Tris(2,3- | 80 | 5–10 | 5–9 | Good |
| 20 | Polyurethane resin | dibromopropyl) | 120 | 0–7 | <5 | Good |
| 21 | 100 parts by weight | phosphate | 160 | Immediately fire died out | " | Good |
| 22 | | | 200 | Immediately fire died out | " | Slightly bad |
| 23 | Curing agent | | 40 | 5–10 | 8–15 | Good |
| 24 | 25 parts by weight | Tetrabromophthalic anhydride | 80 | 3–6 | 5–11 | Good |
| 25 | | | 120 | 0.5–2 | 5–7 | Good |
| 26 | | | 160 | Immediately fire died out | <5 | Good |
| 27 | | | 200 | Immediately fire died out | " | Slightly bad |
| 28 | | | 40 | 8–10 | 5–10 | Good |
| 29 | | | 80 | 0–5 | <5 | Good |
| 30 | | Tetrabromobisphenol A | 120 | Immediately fire died out | " | Good |
| 31 | | | 160 | Immediately fire died out | " | Slightly bad |
| 32 | | | 200 | Immediately fire died out | " | " |

(Notes)
Polyurethane resin: Retan No. 3000 (Manufactured by Kansai Paint Co., Ltd. in Japan)
Curing agent: Curing agent for Retan No. 3000 (Manufactured by Kansai Paint Co., Ltd. in Japan)
Curing conditions: 80° C., 15 minutes

TABLE 3

| Experiment No. | Resin | Flame retardant Name | Amount blended (parts by wt.) | Fire proofness, combustion test according to MVSS No. 302 Burning rate (cm/min) | Burning distance (mm) | Adhesion, peeling test by adhesive tape |
|---|---|---|---|---|---|---|
| 33 | | — | — | 18–22 | Continued to burn | Good |
| 34 | | | 40 | 10–15 | 15–19 | Good |
| 35 | | | 80 | 5–15 | 10–15 | Good |
| 36 | Polyester resin 100 parts | Tris(2,3-dibromopropyl) | 120 | 1–5 | <5 | Good |
| 37 | by weight | phosphate | 160 | Immediately fire died out | " | Good |
| 38 | Reaction accelerator | | 200 | Immediately fire died out | " | Slightly bad |
| 39 | 1 part | | 40 | 8–15 | 10–15 | Good |
| 40 | by weight | | 80 | 5–10 | 5–10 | Good |
| 41 | | Tetrabromophthalic anhydride | 120 | 2–3 | 5–8 | Good |

TABLE 3-continued

| Experiment No. | Resin | Flame retardant Name | Amount blended (parts by wt.) | Fire proofness, combustion test according to MVSS No. 302 Burning rate (cm/min) | Burning distance (mm) | Adhesion, peeling test by adhesive tape |
|---|---|---|---|---|---|---|
| 42 | | | 160 | Immediately fire died out | <5 | Good |
| 43 | | | 200 | Immediately fire died out | " | Slightly bad |
| 44 | | | 40 | 6–18 | 15–20 | Good |
| 45 | | Tetrabromo- | 80 | 6–10 | 5–8 | Good |
| 46 | | bisphenol A | 120 | 2–4 | 5–6 | Good |
| 47 | | | 160 | Immediately fire died out | <5 | Good |
| 48 | | | 200 | Immediately fire died out | " | Slightly bad |

(Notes)
Polyester resin: Nitoron V280 (manufactured by Nitto Denki Kogyo K.K. in Japan)
Reaction accelerator: Catalyst No. 6 for Nitron V 280 (manufactured by Nitto Denki Kogyo K.K. in Japan)
Curing conditions: 130° C. 6 minutes

EXAMPLE 2

Figure 2:
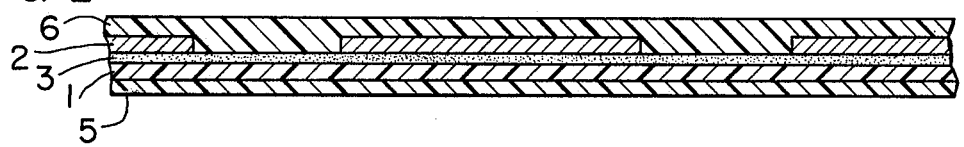

In this example, a fire proofing film 5 was formed on a substrate 1 of a similar flexible printed circuit board to that of Example 1 as shown in FIG. 1. However, the insulating film 4 in Example 1 was replaced by a flame retardant-containing ink film 6 as shown in FIG. 2.

As the resin constituting the fire proofing ink film 6 used in this example, an ultraviolet ray-setting type epoxy resin was used to shorten a curing time remarkably and reduce the cost. As the flame retardant a blend of, a halogenated organic phosphoric acid ester and a halogenated aromatic compound was used. Also, it is needless to say that the constituent materials required for the constitution of the fire proofing ink such as a sensitizer for effecting ultraviolet ray cure, a pigment for forming a colored coating film are contained.

Figure 3:
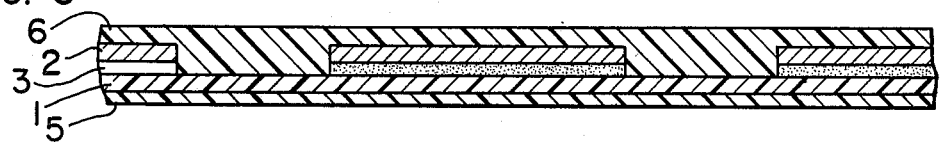

The process for producing the fire-proof flexible printed circuit board will be explained below. The steps of forming a fire proofing film 5 on a substrate 1 in FIG. 3, fastening a copper foil 2 thereonto with an adhesive 3, and then carrying out etching treatment are the same as the steps in Example 1. Therefore, the explanation of these steps is omitted. On the thus formed circuit board, an ultraviolet ray-setting type ink containing said flame retardent having an adjusted viscosity of 2600 to 3700 cps/25° C. was printed through a screen made of a 225 mesh Tetoron (a polyester fiber) plate, allowed to stand at room temperature for 2 to 3 minutes to smooth the printed surface, and then cured by the use of an ultraviolet ray irradiation apparatus to form a film 6. Curing conditions were supplied by a mercury-vapor lamp of 80 W/cm×2, an irradiation distance of 5 cm and a conveyor speed of 3 m/min. The thickness of the film 7 after curing was 10 to 30μ.

Next, this example will be explained below in reference to the experiment results as shown in Table 4. The experiment results in Table 4 show fire proofness and adhesion between the copper foil 2 or the substrate 1 and the flame proofing ink film 6. In this example, as the resin for the ultraviolet ray-setting type ink, an epoxy acrylate resin was used. As the flame retardant, tris(2,3-dibromopropyl) phosphate and tetrabromobenzene were selected from halogenated organic phosphoric acid esters and halogenated aromatic compounds, respectively. A blending ratio of these flame retardants to the respective resins for the ink was varied and the characteristics of the resulting fire-proof flexible printed circuit boards were evaluated.

As a result, as shown in Table 4, a blending ratio satisfying fire proofness and adhesion was able to be obtained in all the flame retardants. Thus, in the present inventors' experiments, the samples of Experiments Nos. 50, 54 and 55 in Table 4 showed particularly good fire proofness and adhesion. Also, the sample of Experiment No. 49 wherein no flame retardant had been added to the ink film showed barely satisfactory fire proofness since the fire proofing film 5 had been formed on the surface of the substrate 1. It was found that, even if no fire proofing film 5 was formed on the surface of the substrate 1 on the contrary, barely satisfactory fire proofness was able to be ensured by adding a flame retardant to the ink film.

In this example, an ultraviolet ray-setting type ink was used as the fire proofing ink, but the fire proofing inks used are not limited to this type. Generally hot setting type or a cold setting type may also be used. As the flame retardant, halogenated aliphatic compounds, halogenated aromatic acid anhydrides and inorganic and organic antimony compounds may also be used. Also, these resins and flame retardants may respectively be used in admixture of two or more thereof. The thickness of a coating film and whether or not pretreatment is carried out prior to the coating step are not limited to those as shown in this example.

TABLE 4

| Experiment No. | Resin for printing ink | Flame retardant Name | Amount blended (parts by wt.) | Fire proofness, combustion test according to MVSS No. 302 Burning rate (cm/min) | Burning distance (mm) | Adhesion, peeling test by adhesive tape |
|---|---|---|---|---|---|---|
| 49 | | — | 0 | 10–15 | 5–10 | Very good |
| 50 | | | 10 | Immediately fire died out | <5 | Very good |

TABLE 4-continued

| Experiment No. | Resin for printing ink | Flame retardant Name | Amount blended (parts by wt.) | Fire proofness, combustion test according to MVSS No. 302 Burning rate (cm/min) | Burning distance (mm) | Adhesion, peeling test by adhesive tape |
| --- | --- | --- | --- | --- | --- | --- |
| 51 | Epoxy resin 100 parts by weight | Tris(2,3-dibromopropyl) phosphate | 20 | Immediately fire died out | " | Good |
| 52 | | | 30 | Immediately fire died out | " | Good |
| 53 | | | 40 | Immediately fire died out | " | Good |
| 54 | | Tetrabromobenzene | 10 | Immediately fire died out | <5 | Very Good |
| 55 | | | 20 | Immediately fire died out | " | Very good |
| 56 | | | 30 | Immediately fire died out | " | Good |
| 57 | | | 40 | Immediately fire died out | " | Good |

(Notes)
Resin for printing ink: UVR 40010 (manufactured by Asahi Kagaku Kenkyusho in Japan)
The same fire proofing film 5 as that in the sample of Experiment No. 10 in Example 1 was formed on the surface of the substrate 1. It was found that almost similar fire proofness to that of the sample of Experiment No. 49 was able to be obtained even in the samples of Experiments Nos. 50 to 57 wherein the fire proofing film 5 was not formed on the surface of the substrate 1.

EXAMPLE 3

In said Example 2, etching treatment was carried out to remove the part of a copper foil other than that required as an electric circuit, but the etching treatment was replaced by die stamping treatment in this example. The composition of the fire proofing ink, the printing method and printing conditions in this example were the same as those in said Example 2, and therefore the explanation of them is omitted. As for the production process used, a substrate 1 consisting of a polyester film was subjected to surface treatment in the same manner as in said Example 2, and a fire proofing film 5 was then spray-coated and cured by heating. An adhesive 3 was inserted between the substrate 1 and a copper foil 2. The steps up to this time were the same as those in Example 1. The copper foil 2 constituting an electric circuit was cut by a stamping die previously heated at 80° C. at a surface pressure of 500 kg/cm² in one second and the unnecessary part of the copper foil and the adhesive was then removed to obtain the desired circuit. Further, the copper foil 2 was pressure-bonded with the substrate 1 under heating to fix the copper foil 2 constituting an electric circuit. The bonding conditions in this case were the same as those in Example 1, that is, temperature 160° C., pressure 6 kg/cm², and time 5 seconds. Thereafter, the surface tension of the substrate 1 was adjusted to 36 dyne/cm or more, and particularly 44 to 48 dyne/cm by ultraviolet ray irradiation treatment in order to improve adhesion again. On the thus formed board, a fire proofing ink having the same constitution as that of the fire proofing ink used in said Example 2 was printed and cured in the same manner and under the same conditions as in Example 2 to form a fire proofing ink film 6.

The experimental results of the fire-proof flexible printed circuit board obtained in this example were similar to the results of Table 4 in said Example 2.

EXAMPLE 4

Figure 4:
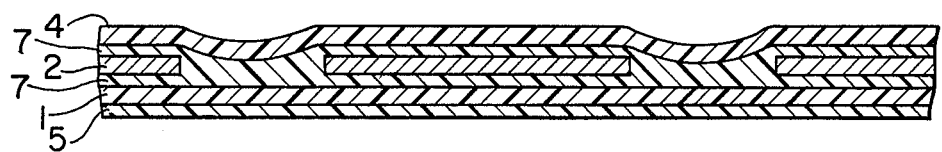

This example is shown in FIG. 4. In this example, the fire proofing treatment of an adhesive 7 for bonding a substrate 1 and a copper foil 2 or an insulating film 4 was carried out in place of the formation of a fire proofing film 5 on the surface of an insulating film 4 in Example 1.

As the adhesive resin constituting the fire-proof adhesive 7 used in this example, a polyester resin was used. As the flame retardant, a halogenated organic phosphoric acid ester or a halogenated aromatic compound was used. It is needless to say that a plasticizer, a diluting solvent, etc. required for the constitution of the adhesive 7 are contained in the adhesive. The production process will be explained below. The steps up to the formation of a fire proofing film 5 on a substrate 1 in FIG. 4 are all the same as those in Example 1. Therefore, the explanation thereof is omitted. In order to bond the thus formed board with a copper foil 2, said adhesive 7 which had been adjusted to a viscosity of 1500 to 2000 cps/25° C. with a mixed solvent was coated onto the polyester film surface of the substrate 1 to be bonded with the copper foil 2 by roll coating. The resulting coating was then dried at 100° C. in a thermostat for 5 to 10 minutes to vaporize the solvent. The thickness of the adhesive film was 20 to 30μ in this case. The substrate 1 was then bonded with the copper foil 2 constituting an electric circuit by an oil pressure press. The bonding conditions in this case were temperature 120° C., pressure 2 kg/cm² and time 5 seconds. The unnecessary portion of the copper foil was removed by dipping in a copper etching solution consisting mainly of ferric chloride and the remainder was then washed with water and dried in the same manner as in Example 1. Further, the adhesive 7 was coated onto an insulating film 4 by roll coating in the same manner as in said substrate 1. The solvent was vaporized and the insulating film 4 thus coated with the fire-proof adhesive 7 was then coated onto the copper foil 2 on the substrate 1 and contact bonding was carried out in the same manner as described above.

Then, this example will be explained below in detail with reference to the experimental results in Table 5. Fire proofness and adhesion between the copper foil 2 constituting an electric circuit and the substrate 1 or the insulating film 4 (that is, the adhesive force of the adhesive 7) are shown in Table 5. In this example, a polyester resin was used as the adhesive resin, and as the flame retardant, tris(2,3-dibromopropyl) phosphate and hexabromobenzene were selected from halogenated organic phosphoric acid esters and halogenated aromatic compounds, respectively. A blending ratio of these flame retardants to the adhesive was varied and fire proofness and adhesion were evaluated. As a result, a blending ratio satisfying both fire proofness and adhesion was able to be obtained in the case of all the flame retardants. Thus, it was found by the present inventors' experiments that the samples of Experiments Nos. 59, 63 and 64 in Table 5 showed particularly good fire proofness and adhesion. Also, the sample of Experiment No. 58 wherein the adhesive 7 contained no flame retardant showed barely satisfactory fire proofness since the fire proofing film 5 was formed on the surface of the substrate 1. It was found that, on the contrary, barely satisfactory fire proofness was also able to be ensured by adding a flame retardant to the adhesive 7 even if the fire proofing film 5 was not formed on the surface of the substrate 1.

Also, the adhesive 7 to be fire proofed in this example is not limited to polyester resins but the other resins such as polyurethane resins may be used. The flame retardant used in this example may also be a halogenated aliphatic compound, a halogenated aromatic anhydride or an inorganic or organic antimony compound. Further, these resins and flame retardants may respectively be used in admixture of two or more thereof.

nated organic phosphoric acid ester or a halogenated aromatic compound was used. Also, it is needless to say that a plasticizer, a diluting solvent, etc. which are required for the constitution of the adhesive 7 are contained in this example. As the resin constituting the ink, an ultraviolet ray-setting type epoxy resin (UVR 4001G manufactured by Asahi Kagaku Kenkyusho in Japan) was used to shorten curing time greatly and try to reduce the cost as in the ink used in the said Example 2. Also, it is needless to say that the constituent materials such as a sensitizer for effecting ultraviolet-ray cure required for the constitution of the ink 6, a pigment for obtaining a colored coating film, etc. are contained in the ink.

The production process will be explained below. Here, the steps up to the formation of a fire proofing film 5 on a substrate 1 are all the same as in Example 1. Also, the steps of subjecting a copper foil 2 to contact bonding with a fire-proof adhesive 7 under heating and removing the portion other than that required as an electric circuit are all the same as in Example 4. Therefore, the explanation of the steps up to this time is omitted. On the thus formed circuit board, said ultraviolet ray-setting type ink which had been adjusted to a viscosity of 2000 to 2500 cps/25° C. was printed through a screen made of a 250 mesh Tetoron (a polyester fiber), allowed to stand at room temperature for 2 to 3 minutes to smooth the printed surface, and then cured by an ultraviolet ray irradiation apparatus. The curing conditions were supplied by a mercury-vapor lamp 80 W/cm×2, the irradiation distance 20 cm and the irradiation time 8 seconds. The thickness of the film after cure was 10 to 30μ.

TABLE 5

| Experiment No. | Adhesive resin | Flame retardant Name | Amount blended (parts by wt.) | Fire proofness, combustion test according to MVSS No. 302 Burning rate (cm/min) | Burning distance (mm) | Adhesion, 180° T-peeling test |
|---|---|---|---|---|---|---|
| 58 | | — | — | 10–15 | 5–10 | Very good |
| 59 | | | 5 | Immediately fire died out | <5 | Very good |
| 60 | | Tris(2,3-dibromo propyl) phosphate | 10 | Immediately fire died out | " | Good |
| 61 | Polyester resin 100 parts by weight | | 15 | Immediately fire died out | " | Passable |
| 62 | | | 20 | Immediately fire died out | " | Passable |
| 63 | | | 5 | Immediately fire died out | <5 | Very good |
| 64 | | Hexabromobenzene | | fire died out | " | Good |
| 65 | | | 15 | Immediately fire died out | " | Good |
| 66 | | | 20 | Immediately fire died out | " | Passable |

(Notes)
Adhesive resin: Starfix SSO-3 (manufactured by Fuji Photo Film Co., Ltd. in Japan)
The same fire proofing film 5 as that used in the sample of Experiment No. 10 in Table 1 in Example 1 was formed on the surface of the substrate 1 in FIG. 4. However, it was found that even the samples of Experiments Nos. 59 to 66 wherein the fire proofing film 5 was not formed on the surface of the substrate 1 gave almost similar fire proofness to that of the sample as shown in Experiment No. 58.

EXAMPLE 5

Figure 5:
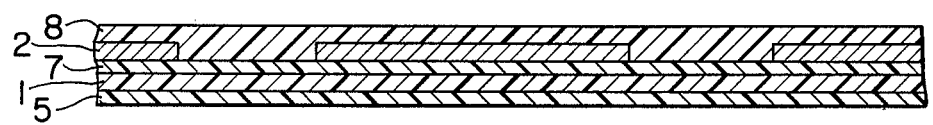

This example as shown in FIG. 5 is the same as said Example 4 in that a flame retardant is added to an adhesive 7, but is different from the Example 4 in that an ink film 8 is formed in place of an insulating film 4.

As the adhesive resin constituting the fire-proof adhesive 7 used in this example, a polyester resin was used as in the said Example 4. As the flame retardant, a haloge- The experimental results obtained in this example was almost similar to those as shown in Table 5 in Example 4. The detailed explanation thereof is omitted here since it is almost the same as the explanation in Example 4.

As described above, the fire-proof flexible printed circuit board according to the present invention can be obtained by subjecting a resin flexible film to surface treatment and then forming a fire proofing film thereon. Even when the flexible printed circuit board is used in a bent state in an automobile, etc., the fire proofing film is not peeled off from the flexible film and the fire proofing of the flexible printed circuit board as the desired object can be accomplished. Therefore, it is expected that the fire-proof flexible printed circuit board according to the present invention has various uses.

What is claimed is:

1. A flexible, fire-resistant printed circuit board comprising
    a copper foil defining an electric circuit, and
    a flexible resin film adhered to one surface or both surfaces of said copper foil with an adhesive, said flexible resin film selected from the group consisting of polyester, polyvinyl chloride, polypropylene, polyethylene, polyamide and polyimide,
    wherein said flexible resin film prior to adherence being subjected to a surface treatment to provide a surface tension of from 36 to 60 dynes/cm thereon, and a resin film containing a flame retardant is then formed on the treated surface of said flexible resin film.

2. A flexible, fire-resistant printed circuit board according to claim 1, wherein said flexible resin film is subjected to surface treatment by corona discharge to provide a surface tension of 50 to 60 dyne/cm.

3. A flexible, fire-resistant printed circuit board according to claim 1, wherein said resin film containing a flame retardant is produced by adding at most 160 parts by weight of at least one flame retardant material selected from the group consisting of halogenated organic phosphoric acid esters, halogenated aromatic compounds, halogenated aliphatic compounds, inorganic antimony compounds and organic antimony compounds, to 100 parts by weight of at least one resin selected from the group consisting of epoxy resins, polyurethane resins, polyester resins and acrylic resins.

4. A flexible, fire-resistant printed circuit board having a flexible resin film substrate adhered with an adhesive to one surface of a copper foil defining an electric circuit, said flexible resin film selected from the group consisting of polyester, polyvinyl chloride, polypropylene, polyethylene, polyamide and polyimide the surface of said flexible resin film substrate prior to adherence being subjected to a surface treatment to provide a surface tension of from 36 to 60 dynes/cm, a resin film containing a flame retardant formed on the thus treated surface of said flexible resin film, and an ink film containing a flame retardant formed on the other surface of said copper foil.

5. A flexible, fire-resistant printed circuit board according to claim 4, wherein said ink film comprises an ultraviolet ray-setting type epoxy resin which contains at least one fire retardant material selected from the group consisting of halogenated aromatic compounds and halogenated phosphoric acid esters and said ink is printed onto both surfaces of said copper foil to form a film thereon.

6. A flexible, fire-resistant printed circuit board comprising a copper foil defining an electric circuit adhered to a flexible resin film substrate with an adhesive containing a flame retardant, the surface of said flexible resin film prior to adherence being subjected to a surface treatment to provide a surface tension of from 36 to 60 dynes/cm thereon, and a resin film containing a flame retardant subsequently formed on the thus treated surface of said flexible resin film wherein said flexible resin film selected from the group consisting of polyester, polyvinyl chloride, polypropylene, polyethylene, polyamide and polyimide.

7. A flexible, fire-resistant printed circuit board according to claim 6, wherein said adhesive containing a flame retardant is a polyester resin containing therein at least one fire-retardant material selected from the group consisting of halogenated organic phosphoric acid esters and halogenated aromatic compounds.

8. A flexible, fire-resistant printed circuit board wherein one surface of a flexible resin film is subjected to a surface treatment to provide a surface tension of from 36 to 60 dynes/cm thereon, a resin film containing a flame retardant formed on the thus treated surface of said flexible resin film, a copper foil defining an electric circuit adhered to the other surface of said flexible resin film with an adhesive containing a flame retardant, and an ink film is formed on the other surface of said copper foil and wherein said flexible resin film selected from the group consisting of polyester, polyvinyl chloride, polypropylene, polyethylene, polyamide and polyimide.

9. A flexible, fire-resistant printed circuit board including the sequential layers of
    (1) a flame-retardant coating film coated on one side of a flexible substrate;
    (2) a flexible resin film substrate having two surfaces, the surfaces having the flame-retardant resin film thereon having a surface tension of between 36 and 60 dynes/cm, said flexible resin film selected from the group consisting of polyester, polyvinyl chloride, polypropylene, polyethylene, polyamide and polyimide, the opposite surface having;
    (3) an adhesive thereon adhering the flexible resin film to a copper foil layer; and
    (4) A copper foil layer in the form of an electric circuit adhered to the flexible resin film substrate, the flexible, fire-resistant printed circuit board having a burning rate of not greater than 10 cm/min and a burning distance of not greater than 10 min both as measured by MVSS test No. 302.

10. The flexible, fire-resistant printed circuit board according to claim 9 wherein said ahesive contains at least one flame-retardant material therein.

11. The flexible, fire-retardant printed circuit board according to claim 9 further including:
    (5) a resinous ink film printed on the copper foil surface opposite the adhesive.

12. The flexible, fire-resistant printed circuit board of claim 11 wherein the ink film is composed of an ultraviolet light curing resin and at least on flame-retardant material therein.

13. The flexible, fire-resistant printed circuit board of claims 10 or 12 wherein said flame-retardant material is selected from the group consisting of halogenated organic phosphoric acid esters, halogenated aromatic compounds, halogenated aliphatic compounds, inorganic antimony compounds and organic antimony compounds.

* * * * *